United States Patent
Li et al.

(10) Patent No.: US 7,684,467 B2
(45) Date of Patent: Mar. 23, 2010

(54) PERFORMING BLIND SCANNING IN A RECEIVER

(75) Inventors: Junsong Li, Austin, TX (US); Yan Zhou, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 1138 days.

(21) Appl. No.: 11/261,201

(22) Filed: Oct. 28, 2005

(65) Prior Publication Data

US 2007/0098089 A1    May 3, 2007

(51) Int. Cl.
H04B 1/00    (2006.01)

(52) U.S. Cl. ............ 375/147; 375/345; 375/316; 375/343; 348/732; 455/161.1; 455/161.3; 725/118; 702/66

(58) Field of Classification Search ............ 375/147, 375/345, 316; 348/732; 455/161.1, 161.3; 725/118; 702/66
See application file for complete search history.

(56) References Cited

U.S. PATENT DOCUMENTS

| | | | | |
|---|---|---|---|---|
| 5,471,396 A | * | 11/1995 | White | 702/66 |
| 6,038,433 A | * | 3/2000 | Vegt | 455/161.1 |
| 6,434,186 B2 | * | 8/2002 | Dowling | 375/147 |
| 6,816,715 B1 | * | 11/2004 | Mano | 455/161.3 |
| 7,280,164 B2 | * | 10/2007 | Yen | 348/732 |
| 2003/0076899 A1 | | 4/2003 | Kumar et al. | 375/316 |
| 2003/0135814 A1 | | 7/2003 | Greenberg et al. | 714/796 |
| 2005/0117069 A1 | | 6/2005 | McNeely | 348/725 |
| 2005/0265288 A1 | * | 12/2005 | Liu et al. | 370/332 |
| 2006/0037059 A1 | * | 2/2006 | Jin | 725/118 |
| 2007/0081615 A1 | * | 4/2007 | Khoini-Poorfard et al. | 375/345 |

OTHER PUBLICATIONS

U.S. Appl. No. 11/247,477, filed Oct. 11, 2005, entitled "Controlling Gain In A Satellite Receiver" by Ramin Khoini-Poorfard; David Trager.
PCT/US2006/035275 International Search Report With Written Opinion of the International Searching Authority Mailed Feb. 9, 2007.

* cited by examiner

*Primary Examiner*—Sudhanshu C Pathak
(74) *Attorney, Agent, or Firm*—Trop, Pruner & Hu, P.C.

(57) ABSTRACT

In one embodiment, the present invention includes a method for receiving data corresponding to a portion of an incoming radio frequency (RF) spectrum, determining a set of estimates including one or more pairs of a channel frequency estimate and a symbol rate estimate from the data via a linear spectrum analysis, and determining a refined set of estimates from the set of estimates via at least one non-linear spectrum analysis.

22 Claims, 7 Drawing Sheets

PERFORMING BLIND SCANNING IN A RECEIVER

FIELD OF THE INVENTION

The present invention relates generally to performing a blind scan in a receiver and more particularly to performing a blind scan in a satellite receiver.

BACKGROUND

Receivers are used in many applications to receive incoming radio frequency (RF) signals and convert them to baseband signals for desired processing. Various such receivers exist including cellular receivers, radio receivers, satellite receivers such as television satellite receivers, among many others.

A receiver is typically coupled to receive incoming RF signals from an antenna and process the signals in various stages, including amplification stages, filtering stages, down-conversion stages and the like. In a satellite system, such as a direct video broadcasting (DVB) system, an RF spectrum of a very wide band, e.g., approximately 1.3 gigahertz (GHz), includes many individual channels carrying programming. Typically, these channels are separated by some predetermined spacing, and the bandwidth of given channels can vary. A receiver will include a list of available channels within the RF spectrum, their center or carrier frequencies, and corresponding symbol rates, among other such information.

While in many countries this information remains fixed, in other countries, center frequencies and baud rates can change over time. Accordingly, a receiver can include functionality to search for and locate available channels. Such operation is typically referred to as a blind scan. A blind scan is used to establish a list of valid channels with sufficiently estimated carrier frequencies and baud rates for a given frequency band and symbol rate range. However, existing blind scan functionality is relatively inefficient and requires significant time to perform analysis of an RF spectrum, such as a satellite spectrum. This excessive time is incurred as typical blind scans exhaustively scan all possible combinations of frequency shifts and symbol rates to find every possible channel within a given frequency band and baud rate range. Such blind scans generally use a non-linear transform analysis, meaning that the original data has undergone some sort of non-linear transform, the results of which are then analyzed in the frequency domain. However, because of the presence of adjacent channels, inter-modulation products confuse the analysis, as do the effects of filtering and aliasing.

Still further, in known satellite systems when acquiring a desired channel, a dish antenna, e.g., a low noise block (LNB) antenna, is often off by a large frequency from the proper frequency for a selected channel. Such frequency errors can lead to poor performance, or even the inability to properly tune a desired channel.

Thus a need exists for improved blind scan processing, as well as a manner to improve frequency acquisition of a desired channel.

SUMMARY OF THE INVENTION

In one aspect, the present invention includes a method for receiving data corresponding to a portion of an incoming radio frequency (RF) spectrum, determining a set of estimates including one or more pairs of a channel frequency estimate and a symbol rate estimate from the data via a linear spectrum analysis, and determining a refined set of estimates from the set of estimates via at least one non-linear spectrum analysis. In this way, a blind scan process may be performed to obtain channel estimates in a rapid manner. The blind scan process may control various components of a receiver during the process. For example, a fine tuning filter bandwidth of the receiver may be set to correspond to the portion received, which may substantially correspond to a bandwidth maximum of the fine tuning filter.

Different manners of determining the estimates and refined estimates may be implemented. For example, one implementation may include calculating fast fourier transforms (FFTs) for the data, time domain averaging the FFTs into bins, and frequency domain averaging the bins to obtain moving averaged bins, which may then be searched for one or more valid channels. Based on the estimates, a coarse tuning mixer of the receiver may be adjusted, modulation from an output of the coarse tuning mixer can be removed and then FFTs may be calculated from this data.

Using a blind scan process in accordance with an embodiment of the present invention, a host controller of the receiver may obtain information useful in controlling the receiver, such as information regarding the presence of blockers and other adjacent channel information. Using this information, the host controller may more effectively control the receiver to improve performance.

Another aspect of the present invention resides in an apparatus that includes a FFT engine to receive incoming signals and to generate FFTs, a time domain engine to generate time domain averaged FFT bins from the FFTs, and a spectrum analyzer coupled to the time domain engine to determine a raw channel frequency estimate based on a linear spectrum analysis. Still further, a frequency domain engine coupled to the time domain engine may be present to generate frequency domain averaged FFT bins from the time domain averaged FFT bins. Spectrum analyses performed in such an apparatus may include both linear and non-linear analysis. The apparatus may be a blind scan controller that can be integrated with a receiver, such as a satellite receiver, or which may be a separate component such as a separate integrated circuit.

In various implementations, a receiver may be tuned to receive a portion of an RF spectrum and generate digital data corresponding to the portion of the RF spectrum, calculate FFT bins from the digital data, determine if any of the FFT bins are above a predetermined threshold, and retune the receiver to a different portion of the RF spectrum if none of the FFT bins are above the threshold. Otherwise, a linear spectrum analysis may be performed on the bins above the threshold. In this way, a blind scan may be rapidly performed, as any scan steps lacking valid channels can be quickly bypassed.

Methods disclosed herein may further be used during frequency acquisition of a requested channel. In this way, frequency errors due to associated receiver components such as an antenna may be corrected. Thus, a blind scan controller can be used to analyze a portion of an RF spectrum around a desired channel to obtain a correct frequency for acquisition. Then the receiver can be tuned to the correct frequency based on the blind scan controller's analysis.

An apparatus consistent with that described above may be implemented in a system such as a receiver system that includes a low-noise amplifier (LNA) to couple to an input signal source. The LNA may be coupled to a mixer to provide I and Q channel signals which may be processed in I and Q channel paths. In turn, the mixer may be coupled to an analog-to-digital converter (ADC) to convert a wideband signal into a digital signal, which is then processed in digital circuitry. The digital circuitry may include a controller coupled to receive processed digital signals and determine if any potential channels are present. The controller may adjust the mixer if no potential channels are present, and instead determine an estimate pair of channel frequency and symbol rate for one or more potential channels if present. The controller may be implemented in a digital signal processor (DSP), for example.

DETAILED DESCRIPTION

In various embodiments, blind scan processing may be performed using blind scan circuitry to identify channels present within a selected RF spectrum, as well as to determine the symbol rate of such channels, among other such information. In this manner, a list of carrier frequency estimates (CFEs) and corresponding symbol rate estimates (SREs) may be determined. More so, blind scan processing may be rapidly performed, as frequency ranges within an RF spectrum that do not include any valid channels can be quickly bypassed, avoiding the need for exhaustive scanning of the entire RF spectrum. Still further, similar blind scan circuitry may be used to perform frequency acquisition for a desired channel. In such manner, a selected channel can be tuned, even when an associated antenna such as an LNB is uncompensated for frequency errors.

In various implementations, a linear spectrum analysis (LSA) may be performed on incoming digital data to obtain raw estimates for CFE and SRE for a selected portion of an RF spectrum. Such a LSA is different than a non-linear transform-based spectrum analysis, as the original data is fed to a spectrum analyzer directly without any non-linear transform, thus avoiding various inter-modulation products. In addition to CFE and SRE values, LSA may be used to obtain adjacent channel interference (ACI) distribution, co-channel interference (if present), and signal-to-noise levels of available channels. Then using the raw CFEs and SREs, refined estimates for CFEs and SREs may be determined based on various non-linear analyses. Blind scan processing may be performed using a blind scan controller that controls various components of a receiver to improve performance of the blind scan processing. For example, in various implementations a blind scan controller may control both analog and digital circuitry of a receiver. More specifically, a blind scan controller may control analog coarse tuning circuitry and digital fine tuning circuitry of a receiver to obtain information for use in identifying valid channels within the RF spectrum.

Figure 1:
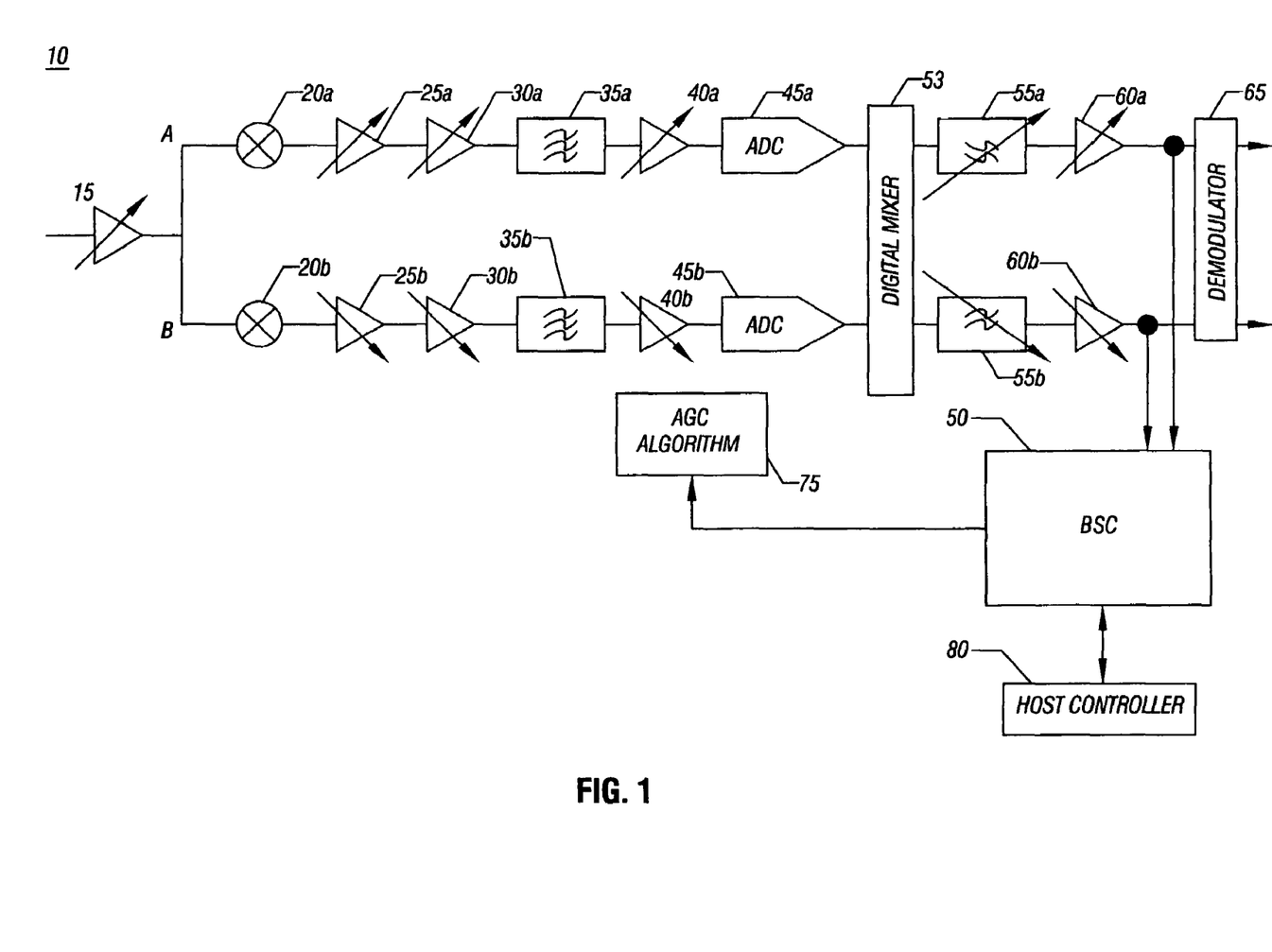
FIG. 1 is a block diagram of a portion of a receiver in accordance with one embodiment of the present invention.

Referring now to FIG. 1, shown is a block diagram of a portion of a receiver in accordance with one embodiment of the present invention. As shown in FIG. 1, a receiver portion 10 is adapted to receive incoming signals, for example, radio frequency (RF) signals. As one example, incoming signals may be an RF spectrum, for example, of a direct broadcast system (DBS) or DVB satellite service, satellite radio, or another RF system. As shown in FIG. 1, incoming signals are received and amplified by a low noise amplifier (LNA) 15. The output of LNA 15 is coupled to a first channel and a second channel, namely an in-phase (I) channel A and a quadrature-phase (Q) channel B. For ease of explanation, the receive path with regard to the in-phase signals will be discussed. However, as shown in FIG. 1, similar circuitry is present in the quadrature-phase path.

Thus as shown in FIG. 1, the output of LNA 15 is provided to a mixer 20a, which downconverts the incoming RF signals to an intermediate frequency (IF). While not shown in FIG. 1, it is to be understood that mixer 20a may mix the incoming signals with a received local oscillator (LO) frequency. In different implementations, a mixer may provide for direct down conversion (DDC) or conversion down to an intermediate frequency signal or a low IF signal. In one implementation, the mixer does not mix a desired channel down to a fixed target IF frequency and then mix the desired channel to DC. Rather, this implementation uses analog coarse tune circuitry to mix the desired channel down to a variable location within a frequency range near DC, and then digital conversion and digital filtering is performed directly on this coarsely tuned channel spectrum.

From mixer 20a, the IF signals are passed through a plurality of gain stages 25a and 30a. In one embodiment, gain stages 25a and 30a each may be programmable gain amplifiers (PGAs), although the scope of the present invention is not so limited. From gain stage 30a, the received signals are provided to a filter 35a, which may be an analog wideband filter having a bandwidth that may span several channels. For example, filter 35a may be a wideband filter that allows a selected frequency band to be passed. In one implementation for a satellite receiver, filter 35a may have a single-side bandwidth of approximately 85 MHz, although other variations are possible. Furthermore, in some implementations filter 35a may be a constant corner frequency filter. However, in other implementations a variable frequency filter may be provided instead.

Still referring to FIG. 1, after filtering, the filtered signals are amplified in a third gain stage 40a, which may be another PGA, for example. The amplified signals are then passed to an analog-to-digital converter (ADC) 45a which converts the signals into a digital representation. In various embodiments, ADC 45a may be a pipeline converter, although in other implementations a flash or interpolated flash-type converter may be provided. In one embodiment, ADC 45a may be a wideband 8-bit ADC that operates at 200 megasymbols per second (MS/s).

Still referring to FIG. 1, the digitized signals are fine tuned in a digital mixer 53, which may include a numerically controlled oscillator (NCO) (not shown in FIG. 1) that in turn receives a frequency control value (not shown in FIG. 1) to control the amount of fine tuning. After fine tuning, the digitized signals are provided to a digital filter 55a, which may be a narrowband digital filter. In various implementations, filter 55a may be a variable filter controlled to pass only a desired channel, e.g., corresponding to a selected television channel. Filter 55a may support both adjacent channel suppression and decimation for various band rates. While the bandwidth of the narrowband filter may vary, in a DBS implementation, a selected channel having a frequency of between approximately 1.0 and 30.0 MHz may be passed.

Still referring to FIG. 1, after being filtered in filter 55a, the digitized data may be amplified in a fourth gain stage 60a, which may be a digital amplifier such as a digital VGA. The resulting signals are then provided to further processing circuitry of a receiver, for example, demodulation circuitry 65. Demodulator 65 may be used to demodulate incoming signals, which are modulated according to a selected modulation scheme, such as QPSK, BSPK, or another such modulation scheme. Also, the resulting signals, after a proper amplitude adjustment, can be either fed to a FFT engine or can be first non-linear transformed and then fed to the same FFT engine to extract spectrum information, as will be discussed further below.

In many implementations, receiver portion 10 shown in FIG. 1 may be integrated on a single substrate. That is, both analog and digital circuitry of receiver portion 10 may be formed on a single substrate incorporated into an integrated circuit (IC). The digital circuitry may further include processing circuitry such as a digital signal processor (DSP), which may perform an automatic gain control (AGC) algorithm 75, in some embodiments. Furthermore, while FIG. 1 shows only a single receiver or tuner, in some embodiments a single substrate may incorporate multiple tuners to allow for simultaneous tuning and processing of multiple selected channels. In such manner, a satellite receiver may tune to a first channel for immediate display on a television or other monitor, while a second tuner may tune to a second channel that is to be stored on a personal video recorder (PVR), for example.

As further shown in FIG. 1, a blind scan controller (BSC) circuit 50 is coupled to receive digital data, i.e., complex I and Q signals output from gain stages 60a and 60b. Based on these signals, BSC circuit 50 may first determine raw CFE and SRE values from the incoming data using a LSA-based algorithm. Then, BSC circuit 50 may determine refined CFE and SRE values using non-linear spectrum analysis algorithms.

As further shown in FIG. 1, BSC circuit 50 is coupled to a host controller 80 which may be a central processing unit (CPU) or other general-purpose processor to control operation of a system including receiver portion 10, for example, a set-top box or a satellite tuner card in a personal computer (PC) or the like. While not shown in FIG. 1 for ease of illustration, BSC circuit 50 may be further coupled to various components of receiver portion 10 to provide control and/or information to these components. Specifically, BSC circuit 50 may control mixers 20a and 20b, ADCs 45a and 45b, filters 55a and 55b, and gain stages 60a and 60b, for example. Furthermore, BSC circuit 50 may further provide information to AGC algorithm 75 for use in setting an appropriate gain for various gain stages of the receiver. For example, BSC circuit 50 may provide information regarding out-of-band blockers, other adjacent channel interference (ACI), and the like that may be used to perform gain control and other receiver control based on this additional information. The additional information may further include indications of noise within frequency bands under analysis due to, for example, digital clocks within the receiver, such as an ADC clock. Using this information, the receiver may be controlled such that resulting noise spurs can be shifted out of any potential channels.

In operation, BSC circuit 50 may first control the receiver to receive incoming data and perform an LSA algorithm to obtain raw estimates. For purposes of the LSA algorithm, BSC circuit 50 may control analog mixers 20a and 20b to generate a selected frequency to mix with the incoming RF spectrum. BSC circuit 50 may further set a sample rate for the ADCs which, in one embodiment may be 200 MS/s. Still further, BSC circuit 50 may control digital filters 55a and 55b to be at their widest bandwidth, in one embodiment. In such manner, BSC circuit 50 may first receive incoming digital I and Q signals corresponding to a widest bandwidth of the digital filters. In one implementation, this single-sided bandwidth may be approximately 60-70 MHz, although the scope of the present invention is not so limited. Using these signals, BSC circuit 50 may calculate raw CFE and SRE values. Based on these values, BSC circuit 50 may then begin a process of refining each of the raw estimates by controlling the mixers, ADCs and gain stages according to the raw values and calculating refined estimates using non-linear spectrum analyses.

Figure 2:
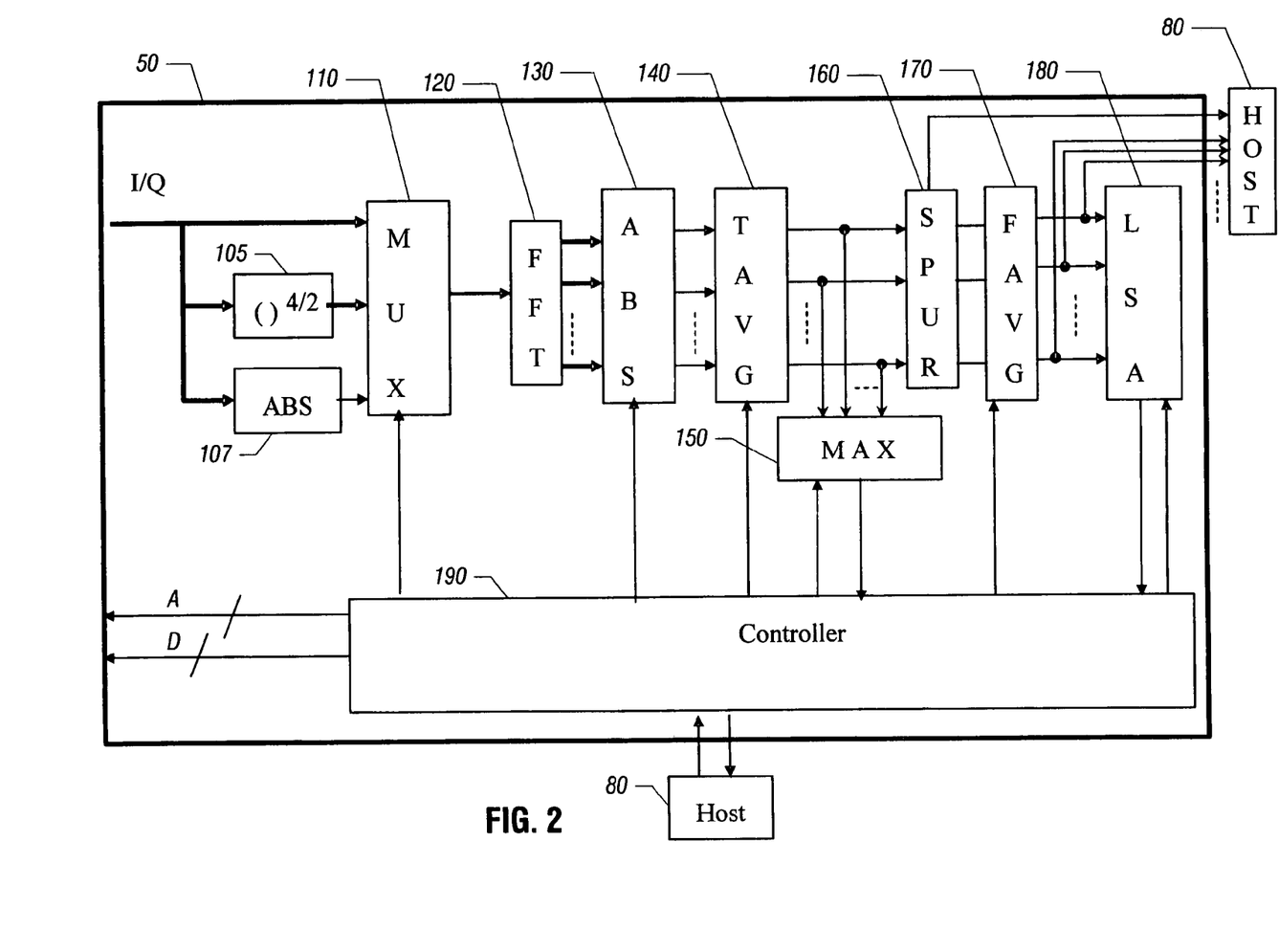
FIG. 2 is a block diagram of a blind scan circuit in accordance with one embodiment of the present invention.

Referring now to FIG. 2, shown is a block diagram of a BSC circuit in accordance with one embodiment of the present invention. As shown in FIG. 2, BSC circuit 50 includes various computation blocks to perform both linear spectrum analysis and nonlinear spectrum analyses along with other processing. In one embodiment, BSC circuit 50 may be implemented as part of a single substrate along with receiver portion 10. For example, BSC circuit 50 may be implemented in a DSP that handles other signal processing functions for the receiver. However, in other embodiments, BSC circuit 50 may be a separate integrated circuit.

As shown in FIG. 2, BSC circuit 50 is adapted to receive incoming digital I and Q data, e.g., from the outputs of gain stages 60a and 60b of FIG. 1. These signals are coupled through a multiplexer 110 and are provided to a fast fourier transform (FFT) engine 120. FFT engine 120 is adapted to perform fast fourier transforms on the incoming signals. In one embodiment, input I/Q samples at 100 Ms/s may be fed to a 2048-point FFT engine, although the scope of the present invention is not so limited.

Using FFT engine 120, a blind scan process may be effected as a precisely-guided search. The FFT complex outputs from FFT engine 120 are provided to an absolute value engine 130, where the complex signals are processed to obtain magnitude or absolute values. From there, the values are sent to a time domain averager 140 in which approximated amplitudes of FFT bins are calculated and averaged over time in a block-by-block manner. The resulting FFT bins are passed through a spur detector 160. Specifically, spur detector 160 may determine whether one or more of the FFT bins corresponds to noise generated in the system, e.g., a harmonic of a digital clock used to control the ADCs, for example. If the magnitude of a FFT bin is larger than both its left-side FFT bins and its right-side FFT bins by a predetermined threshold, then it is determined that this frequency bin corresponds to the spur noise. Control signals may be sent to host 80 so that host 80 can change a frequency of the digital clock to avoid the noise in the further processing stages or even in the demodulation process, if later on a valid channel is found located in this frequency range. In the mean time, FFT bins from both sides of the spur noise can be used to replace the spur-corrupted FFT bins. In other implementations, BSC circuit 50 itself may be adapted to send such control signals.

The resulting FFT bins after the spurs are removed are provided to a frequency domain averager 170 in which a moving average across the FFT bins is performed. In this way, the frequency bins may be smoothed out and channel edges may be sharpened. The resulting smoothed bins may be provided to a linear spectrum analyzer (LSA) 180 to determine a list of raw estimates.

By using a linear spectrum analysis, intermodulation among different channels can be minimized and furthermore adjacent channel effects can also be minimized. Still further, via use of a linear spectrum analysis desired channel energy can be captured to a maximum. In one embodiment, the LSA 180 may initiate channel analysis by using the minimum FFT bin of the 60-70 MHz wide frequency band under analysis as the noise floor. LSA 180 determines if there are any potential channels in the RF portion by searching for bins that are at least a predetermined threshold above this noise floor. For example, LSA 180 may check for bins more than 3 dB above the minimum noise floor. From this linear analysis, both a carrier frequency estimate and a symbol rate estimate may be determined based on multiple passes on the FFT bins, as discussed further below. Note that the symbol rate estimate can be determined from an estimate of the bandwidth of the selected bins. Thus LSA 180 generates a list of raw estimates for the given frequency range. These raw estimates are provided to a controller 190 which is used to control BSC circuit 50 as well as to provide control signals to both analog and digital circuitry of the receiver, as discussed above.

Note that a maximum detector 150 may be coupled to receive the time domain-averaged FFT bins from time domain averager 140. If the difference between the maximum and minimum bins in a given 60-70 MHz frequency band does not exceed, e.g., 3 dB, the entire range may be treated as unoccupied and a blind scan analysis may move forward to the next frequency range. In such manner, blind scan analysis may be rapidly performed, as portions of the RF spectrum that do not include any valid channels can be quickly bypassed without further processing.

If instead it appears that one or more valid channels exist in the frequency range, a spur analysis may be performed to determine whether a spur exists in the frequency range of the valid channels (or not) by using the information obtained through the spur detector 160. If it is determined that one or more of the frequency bins with the valid channels corresponds to such noise, control signals may be sent to host 80 so that host 80 can change a frequency of the digital clock to avoid the noise. In other implementations, BSC circuit 50 itself may be adapted to send such control signals.

Based on the raw estimates, controller 190 may send control signals to cause the receiver to tune to a frequency corresponding to the raw estimates. To perform the refined analysis, incoming complex digital I and Q data may be passed to an absolute value calculator 107 to calculate magnitude values for the incoming complex data. This calculated data may be passed through multiplexer 110 and to FFT engine 120 so that FFT samples corresponding to the absolute value data may be calculated. Then absolute value engine 130 may calculate absolute values of the FFT data, which is then time domain-averaged in time domain averager 140. The time domain averaged values may be provided to maximum detector 150 to find the FFT bin with the maximum power, which corresponds to a refined SRE value, as will be discussed further below. This SRE value is then passed to controller 190 for storage and further use.

A similar iteration is performed next to determine a refined CFE for the corresponding SRE value. Specifically, incoming complex I and Q data are processed in an exponential calculator 105, which performs an exponential function, e.g., raising the incoming complex value to the power of two or four, for example, depending on a given modulation scheme. The processed signals are then coupled through multiplexer 110 and are input into FFT engine 120. The generated FFT bins may be time domain averaged in a block-by-block way. The maximum bin may be selected, which may be used to generate a refined CFE value, as will be discussed further below. Note that the determination of corresponding refined CFE and SRE values may be determined in either order. Such estimate pairs are determined for each raw estimate in a frequency range.

Then, controller 190 may control the receiver to tune to the estimated frequency and perform demodulation at the estimated symbol rate to confirm each refined CFE and SRE pair. Upon completion of such demodulation confirmations for a selected frequency range, the list of confirmed estimate pairs may be sent to host 80, for example, or another location for storage in a table for later use during frequency acquisition. Accordingly, the blind scan process proceeds to the next frequency range.

Figure 3:
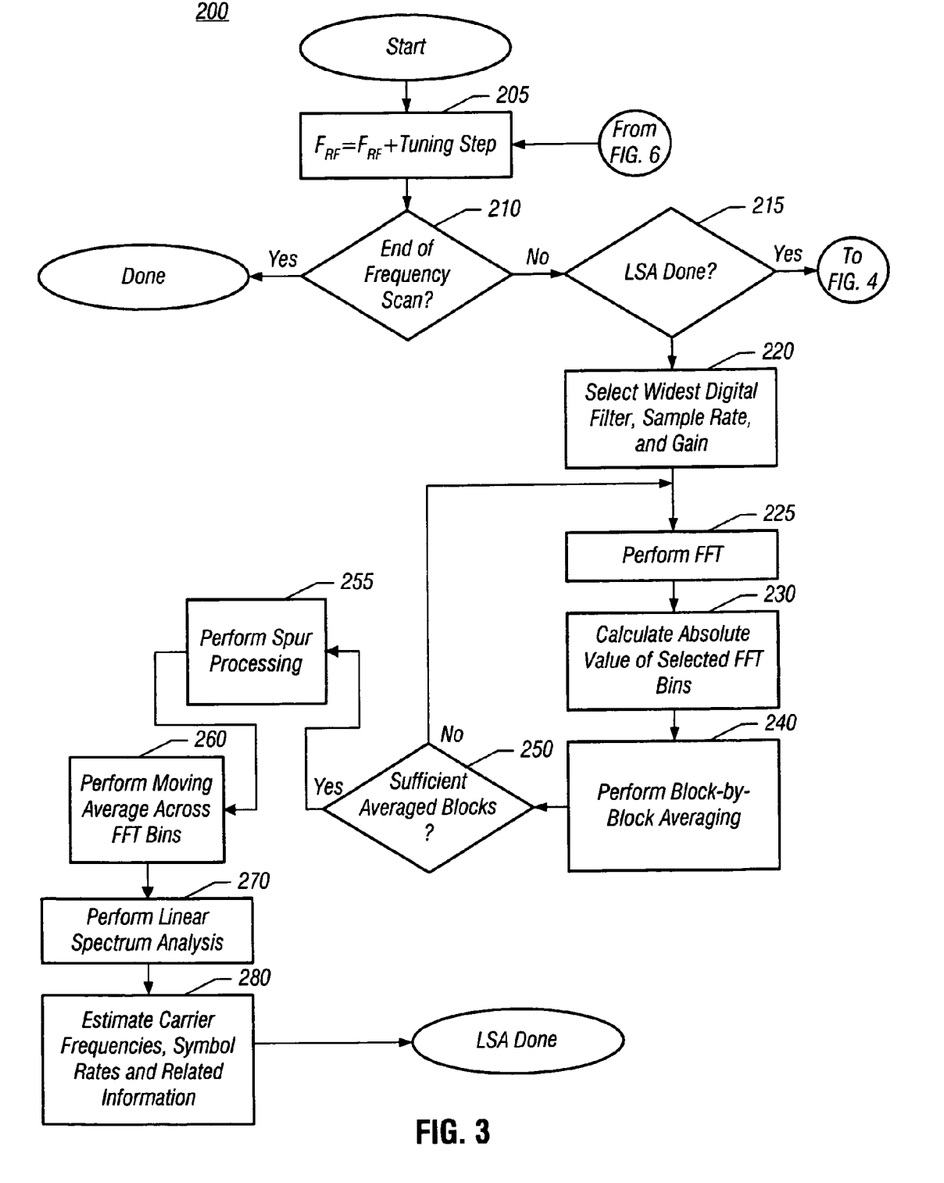
FIG. 3 is a flow diagram of a method in accordance with one embodiment of the present invention.

Referring now to FIG. 3, shown is a flow diagram of a method in accordance with one embodiment of the present invention. More specifically, FIG. 3 shows a linear spectrum analysis algorithm in accordance with one embodiment of the present invention. As shown in FIG. 3, method 200 may begin by setting an RF frequency, e.g., for a coarse tuning mixer (block 205). At the start of a blind scan process, the RF frequency may be set to a lowest frequency of a selected RF spectrum. During the blind scan process, this value may be incremented by the value of a tuning step, which may correspond to a band or portion of the RF spectrum on which a scan step is to be performed. In one embodiment, the tuning step may correspond to a widest bandwidth for a digital filter, for example. Upon completion of blind scanning of a RF portion, e.g., corresponding to the tuning step, the tuning frequency is incremented in block 205.

Still referring to FIG. 3, it may next be determined whether the end of the RF scan has occurred (diamond 210). This end of scan may correspond to the maximum frequency of the RF spectrum at which the blind scan process is completed. If not, control passes to diamond 215. There it may be determined whether a linear spectrum analysis has been completed (diamond 215). If not, the blind scan controller may cause the digital filter bandwidth to be set at its widest value and the blind scan controller may further set corresponding sample rates and gains (block 220).

Next, an FFT calculation may be performed on incoming complex data (block 225). An FFT engine to perform the FFT calculations need not operate in real time, reducing computation complexity and costs. The incoming data may correspond to complex I and Q outputs of the digital filter, which may be an anti-alias filter, in some embodiments. Then, an absolute value of the selected FFT bins may be calculated (block 230). The bins may then be averaged on a block-by-block basis (block 240) and an averaging counter is incremented by one every time a new block of FFT bins is accumulated with current results. This time domain averaging may suppress noise and data randomness. Next, it may be determined whether sufficient averaged blocks are present (diamond 250). For example, it may be determined if the value of the averaging counter is more than a predetermined number. If not, control passes to block 225. If sufficient average blocks are present, control passes to block 255. There, a spur detector may detect any spurs existing and replace spur-corrupted FFT bins with bins from both sides of such a spur. Once spurs are removed from the FFT bins, control passes to block 260. There, a moving average across the FFT bins may be performed (block 260). This frequency domain moving average may further smooth out the data in the FFT bins. Based on the averaged FFT bins, a linear spectrum analysis may be performed (block 270).

Various manners of performing linear spectrum analysis may be implemented. In one embodiment, the linear spectrum analysis may be performed to find valid channels within the RF portion under analysis. Specifically, it is known that typical valid channels for a DVB-S system are of the shape of a root-raised cosine (RRC). Any valid/useable channels should have FFT bins having a power at least a certain amount above a noise floor. For example in one embodiment, valid channels may have a power level at least 3 dB higher than the noise floor. For each RF portion under analysis, the minimum power FFT bin can be treated as the local noise floor and used as a reference point for any potential channels. A potential channel is indicated for any FFT bin that is at least 3 dB above the noise floor.

In one embodiment, multiple pass searches may be performed by LSA 180 to determine raw CFEs. Specifically, a first pass search may be performed based on maximum/minimum bins in the time-domain frequency averaged FFT bins. As described above, this first pass search may quickly determine whether any potential channels exist in the RF portion by determining if the difference between maximum and minimum bins is greater than a threshold value, e.g., 3 dB. Then, a second pass search may be performed. This pass may first identify the up-slope of a potential channel once a FFT bin is 3 dB higher than the noise floor. The analysis may keep moving toward the signal band and get as close as possible to a 1 dB corner of the RRC spectrum. Once it is determined that the signal is in-band, the analysis may search for a down-slope edge. Whenever there is a 1 dB drop of the current FFT bin compared to the in-band FFT bin, the other edge of the signal band is deemed identified. This process may be performed until the last FFT bin is analyzed. Thus the result of this second pass search is a list of potential up-slope and down-slope band edges. Finally, a third pass search may be performed in which an approximated mean value of each potential channel is calculated. This mean in-band FFT bin value may be used as a reference to refine the 1 dB corners of the channel. Once two 1 dB corners are found for a potential channel, the center of the two 1 dB corners is used as the raw CFE estimate of that potential channel and the distance between these two corners is used as the raw SRE estimate of that potential channel. Thus from the linear spectrum analysis, raw CFEs and SREs may be obtained, along with related information (block 280). For example, information regarding ACI, signal-to-noise ratios, and other such information may be obtained and provided to, e.g., a host controller for use in controlling a receiver.

In some embodiments, if a potential channel is on the edge of the RF portion under analysis, different manners of compensating for such an edge-located channel can be effected. In one embodiment, information regarding the edge-located channel may be stored and later combined with additional information from a next RF portion under analysis. Alternately, when scanning the next portion of the RF spectrum, a certain amount of back-off RF tuning may be applied such that the edge-located channel is fully within the spectrum of the next RF portion under analysis. For example, the amount of back-off tuning may retune the receiver at least to the up-slope corner frequency of the edge-located potential channel.

Figure 4:
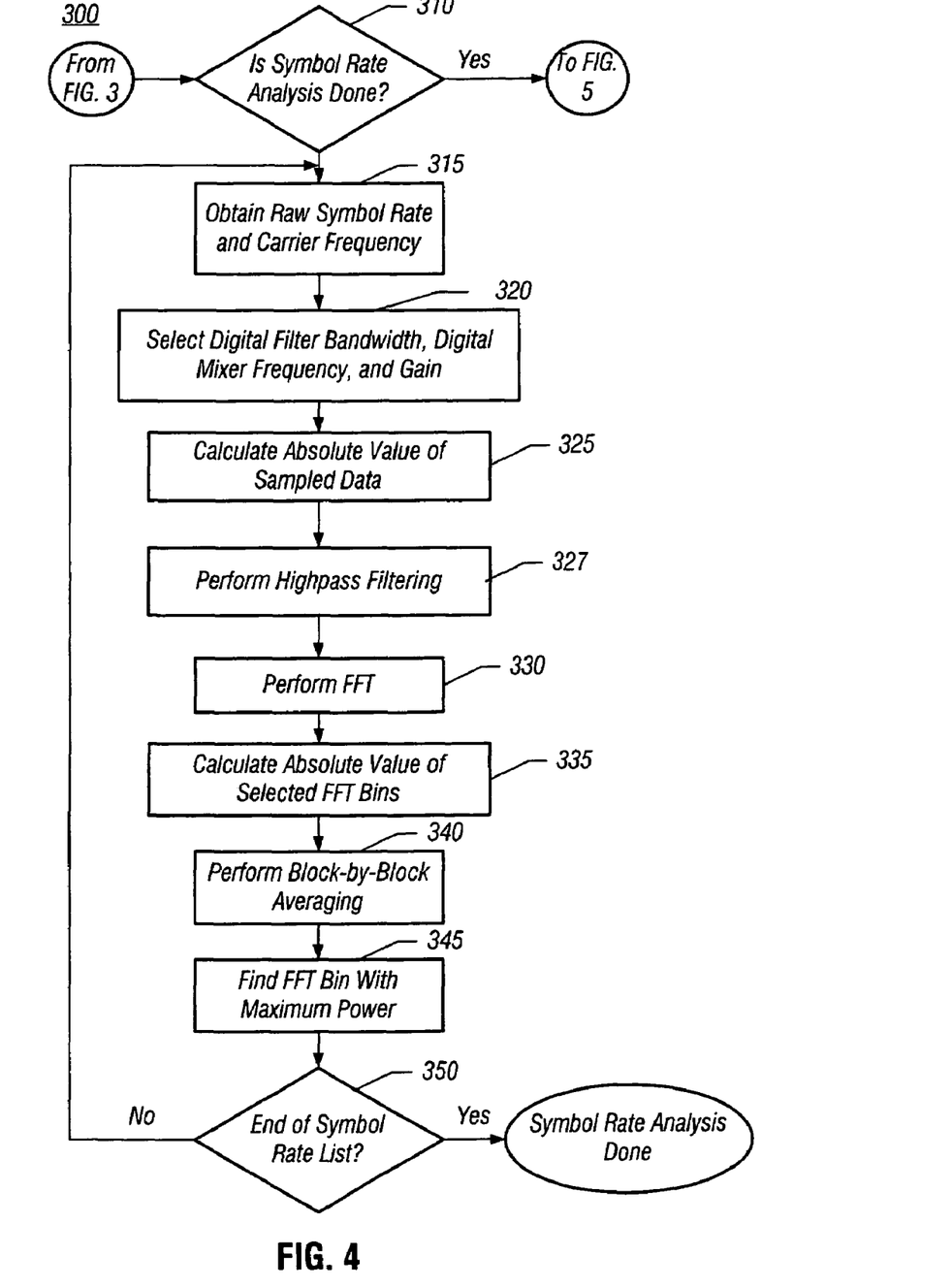
FIG. 4 is a flow diagram of a method for obtaining refined symbol rate estimates in accordance with an embodiment of the present invention.

Referring now to FIG. 4, shown is a flow diagram for obtaining refined symbol rate estimates in accordance with an embodiment of the present invention. As shown in FIG. 4, method 300 may begin by receiving control from diamond 215, discussed above with regard to FIG. 3. First, it may be determined whether symbol rate analysis has been completed (diamond 310). If not, control passes to block 315. There a raw symbol rate and carrier frequency is obtained from a list of the raw estimates obtained as described above (block 315). Based on the symbol rate and carrier frequency, the digital filter bandwidth may be set, along with the digital mixer frequency and gain of the digital gain stages (block 320). For example, the digital fine tuning frequency of the digital mixer may be set according to the carrier frequency estimate and a digital filter/decimator may be selected to suppress, e.g., ACI interference.

Next, incoming complex I/Q data samples may have a calculation performed on them, namely an absolute value calculation to obtain magnitude information (block 325). Next, the calculated magnitude signal is passed through a high pass filter to suppress low frequency components in the signal (block 327). In one embodiment, a simple one step differentiator may be used, e.g., output(n)=input(n)−input(n−1), where n is the discrete time index output of the filter, and input is the input magnitude signal. After this, an FFT calculation may be performed on this high pass filtered magnitude-transformed data (block 330). Then, an absolute value of the selected FFT bins may be calculated (block 335). Then block-by-block averaging of the selected FFT bins may be performed to smooth the data in the time domain (block 340). Finally, the FFT bin having the maximum power may be determined (block 345). This maximum FFT bin may correspond to the symbol rate estimate for the selected carrier frequency. This SRE value may be stored, e.g., in a controller of the blind scan circuit.

Next, it may be determined if any other raw SRE values exist in a list of raw estimates for the frequency range under analysis (diamond 350). If additional raw SRE estimates are present, control passes to block 315 discussed above. If instead no further SRE values remain, the SRE analysis of method 300 is completed. It is to be understood that while described with this particular implementation in the embodiment of FIG. 4, the scope of the present invention is not so limited.

Figure 5:
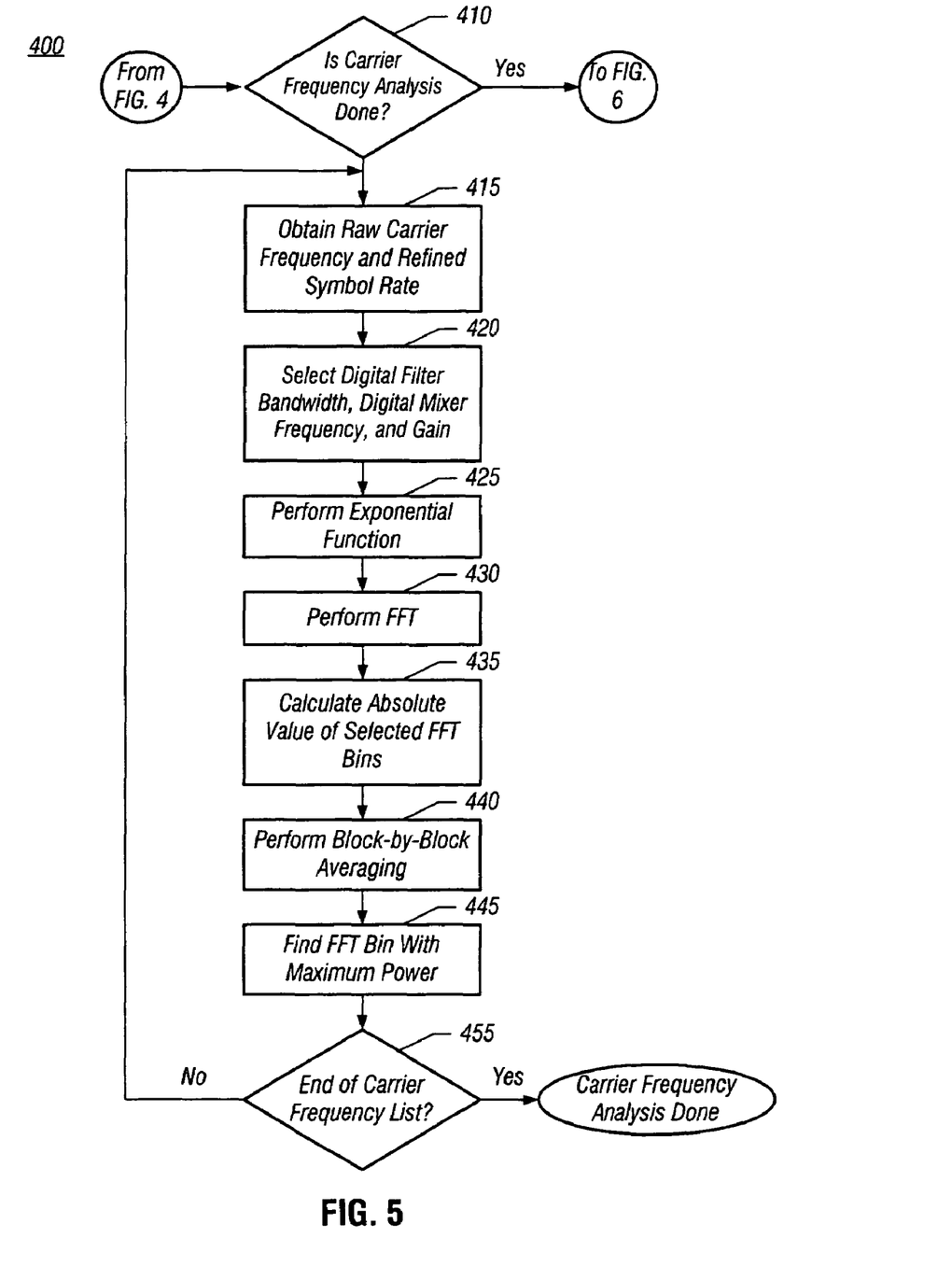
FIG. 5 is a flow diagram of a method for determining refined carrier frequency estimates in accordance with one embodiment of the present invention.

Referring now to FIG. 5, shown is a flow diagram of a method for determining carrier frequency estimates in accordance with one embodiment of the present invention. Referring to FIG. 5, method 400 may begin by determining whether carrier frequency analysis is to be performed (diamond 410). In one embodiment, diamond 410 may receive control from diamond 310 of FIG. 4, discussed above. If it is determined that carrier frequency analysis is to be performed, control passes to block 415. There, a raw carrier frequency estimate and a corresponding refined SRE such as that obtained in accordance with the method of FIG. 4 may be obtained.

Based on the symbol rate and carrier frequency, the digital filter bandwidth may be set, along with the digital mixer frequency and gain of the digital gain stages (block 420). Next, an exponential function may be performed on incoming complex I/Q data, with different functions performed based on a type of modulation to remove modulation effects (block 425). For example, in a QPSK scheme, the incoming complex I/Q data may be raised to a fourth power, while for BSPK modulation, incoming complex I/Q data may be raised to a second power. Next, an FFT calculation may be performed on the sampled data (block 430). Then, an absolute value of the selected FFT bins may be calculated (block 435). These absolute values are then block-by-block averaged to smooth the data in the time domain (block 440). Finally, the FFT bin having the maximum power may be determined (block 445). The actual frequency may be the value of the selected maximum FFT bin divided by the value of the exponential function (e.g., 4 or 2). This actual frequency may thus correspond to an error of the raw carrier frequency estimate, and thus is added to the raw CFE estimate to obtain the refined CFE estimate. This CFE value may be stored, e.g., in a controller of the blind scan circuit in association with the corresponding SRE value. Next, it may be determined if any other raw CFE values exist in a list of raw estimates for the frequency range under analysis (diamond 450). If additional raw CFE estimates are present, control passes to block 415 discussed above. If instead, no further CFE values remain, the CFE analysis of method 400 is completed. It is to be understood that while described with this particular implementation in the embodiment of FIG. 5, the scope of the present invention is not so limited. For example, the channel frequency estimation may be performed prior to symbol rate estimation. Furthermore, in such embodiments refined carrier frequency information obtained may be used in setting the digital mixer and filter values during corresponding symbol rate estimation.

Figure 6:
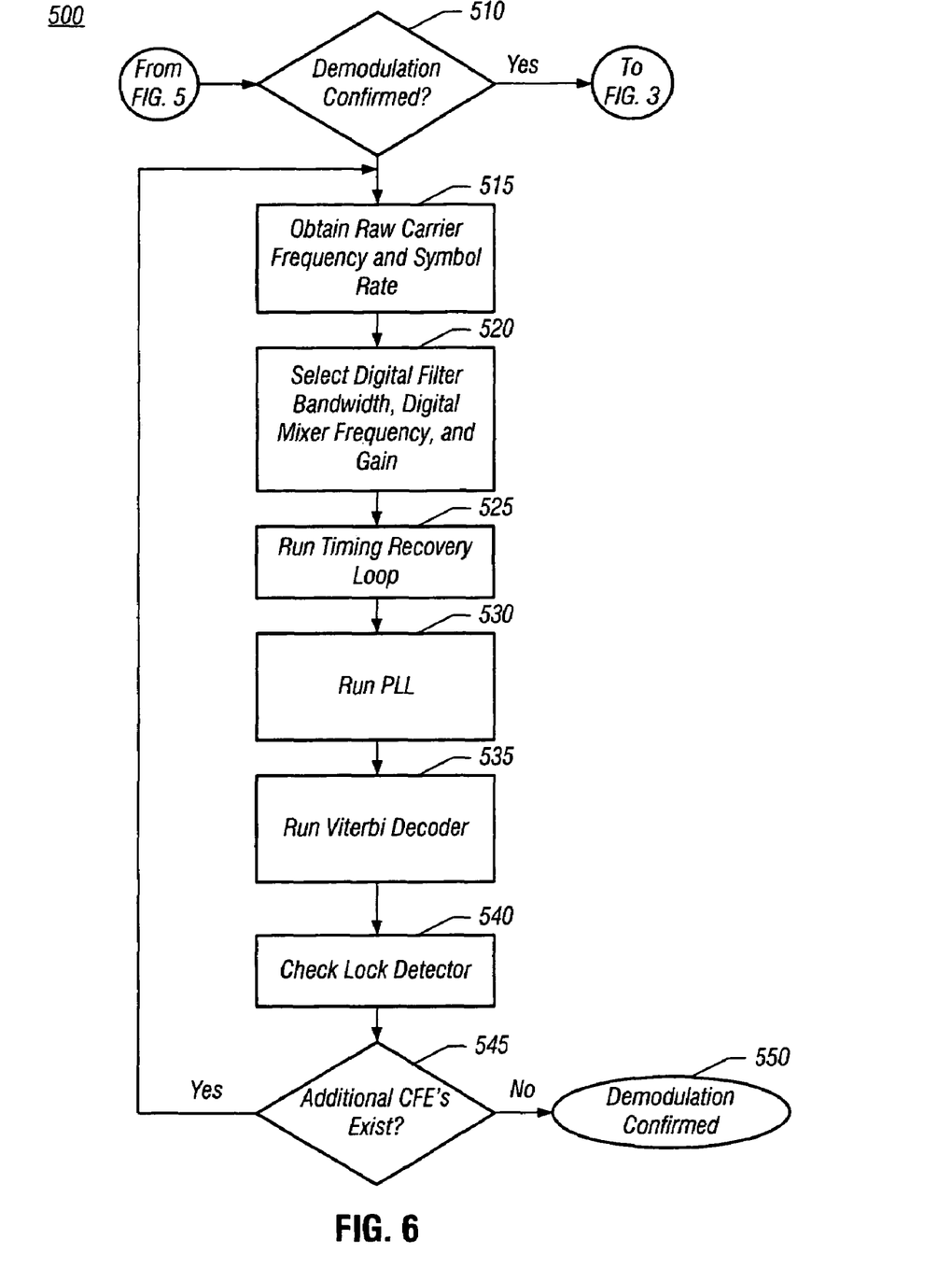
FIG. 6 is a flow diagram of a method for confirming a pair of carrier frequency estimates and symbol rate estimates in accordance with an embodiment of the present invention.

Referring now to FIG. 6, shown is a flow diagram of a method of confirming a CFE and SRE pair in accordance with an embodiment of the present invention. As shown in FIG. 6, method 500 may begin by determining whether demodulation is to be confirmed (diamond 510). In one embodiment, diamond 510 may receive control from diamond 410 of FIG. 5, discussed above. If demodulation has been confirmed, control may pass back to block 205 of FIG. 3, where coarse tuning circuitry may be set to a next value corresponding to the present value plus a step increment, e.g., corresponding to the width of the digital filter.

If demodulation is to be confirmed, the refined pair may be obtained (block 515). For example, the refined estimates may be obtained from a storage of the controller. Next, based on the symbol rate and carrier frequency, the digital filter bandwidth may be set, along with the digital mixer frequency and gain of the digital gain stages (block 520). Accordingly, the receiver is set up for the carrier frequency and symbol rate corresponding to a valid channel. Incoming data is then run through a timing recovery loop (block 525). Further, a phase-locked loop (PLL) may be performed to lock onto the carrier frequency obtained (block 530). Further, a selected demodulation scheme may be performed (block 535). For example, demodulated data may be run through a Viterbi decoder. Furthermore, the data from the refined estimates may be decoded to confirm the validity of the search results and also to obtain channel identification codes corresponding to the refined estimates. Next, a lock detector may be checked after a preselected time to confirm channel lock (block 540). When channel lock has been confirmed, the stored pair may be indicated as valid, e.g., via a valid bit. Next it may be determined whether additional refined pairs exist to be confirmed (diamond 545). If so, control passes back to block 515. If not, demodulation may thus be confirmed (oval 550). While described with this particular implementation, in the embodiment of FIG. 6, it is to be understood that the scope of the present invention is not so limited.

After a list of valid channels has been obtained and stored, this information may be used in the course of frequency acquisition. More particularly, blind scan circuitry may be used to acquire a center frequency of a desired channel as a LNB associated with a receiver may suffer from frequency inaccuracy, which may be as great as 5 MHz in some embodiments. To perform frequency acquisition, a digital filter may be set to its widest value and incoming signals may be received and processed to find the RF portion within which the desired channel is located. Then, a full blind scan process may be performed to obtain a raw channel frequency estimate using a linear spectrum analysis. Then based on the raw channel frequency estimate and corresponding SRE, the digital filter bandwidth, digital receiver gain and sample rate may be set up. Incoming signals may then be subjected to a non-linear spectrum analysis to obtain a plurality of time domain averaged FFT bins. The bin having the maximum value may thus correspond to the correct center frequency. The actual frequency may be the value of the selected maximum FFT bin divided by the value of the exponential function (e.g., 4 or 2). This actual frequency may thus correspond to an error of the raw carrier frequency estimate, which is added to the raw CFE estimate to become the refined CFE estimate. Using this value, the receiver may be tuned to the correct frequency to thus compensate for LNB frequency errors.

Figure 7:
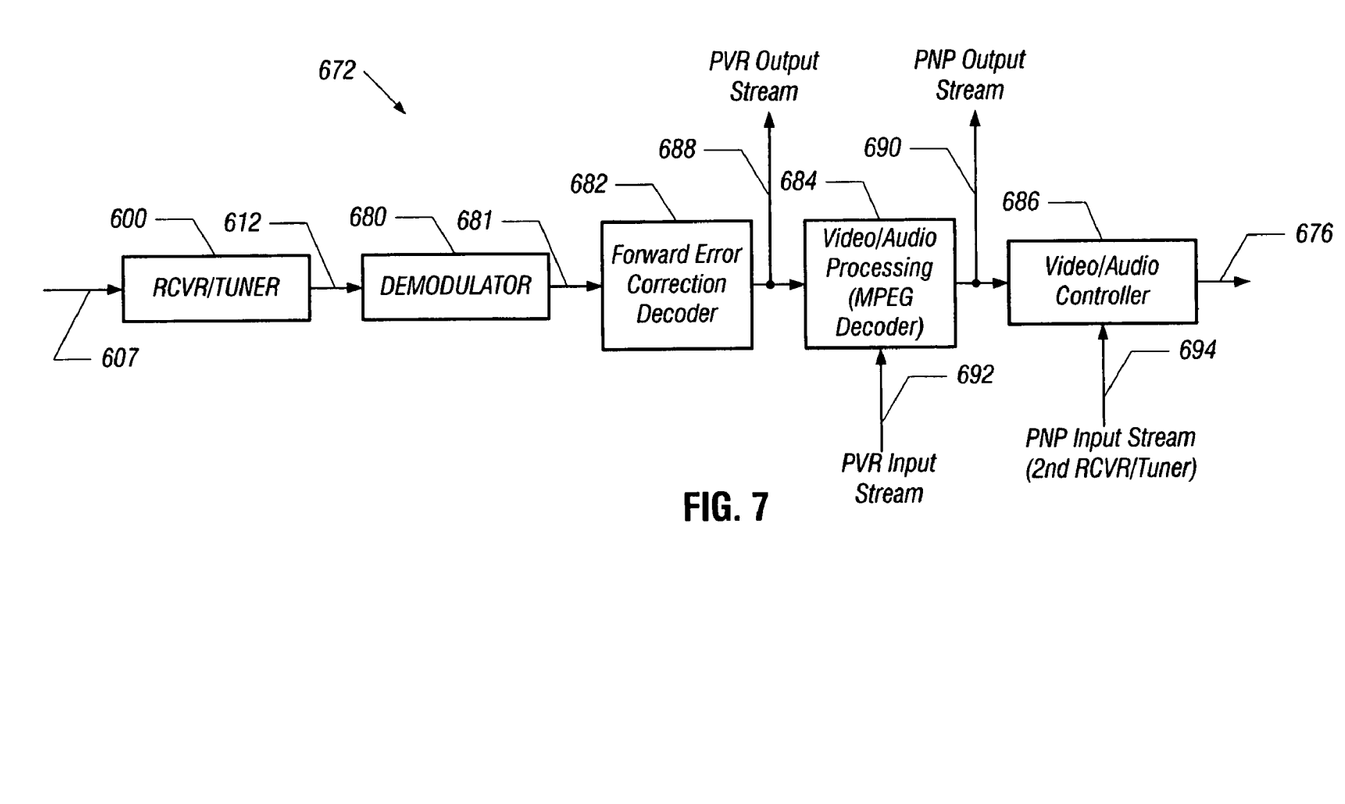
FIG. 7 is a block diagram of a system in accordance with one embodiment of the present invention.

FIG. 7 is a block diagram of a system in accordance with one embodiment. As one example, system 672 may be a satellite set-top box that includes receiver circuitry 600 as shown in FIG. 7. Of course, embodiments of the present invention may be used in connection with other systems. An input signal spectrum 607 can be, for example, 32 transponder channels between 950 MHz and 2150 MHz with each transponder channel carrying a number of different program channels. This signal spectrum 607 can be processed by the receiver/tuner 600 to provide digital baseband output signals 612 that represent a tuned transponder channel. These output signals 612 can then be processed by a demodulator 680 that can tune one of the program channels within the tuned transponder channel. The output signal 681 from the demodulator, which represents a tuned program channel within the transponder channel that was tuned by the receiver/tuner 610, can then be processed with a forward error correction decoder 682 to produce a digital output stream. This digital output stream is typically the data stream that is stored by personal video recorders (PVRs) for later use and viewing by a user, as represented by the PVR output stream 688. The output of the decoder 682, or the stored PVR data as represented by PVR input stream 692, can then be processed by video/audio processing circuitry 684 that can include processing circuitry such as an MPEG decoder.

The output of the processing circuitry 684 is typically the digital video data stream that represents the program channel and is used for picture-in-picture (PnP) operations, for example, where system 672 includes two tuners with one tuner providing the primary viewing feed and a second tuner providing the PnP viewing feed. The output of the processing circuitry 684, as well as a PnP input stream 694 from a second tuner if a second tuner is being utilized for PnP operations, can be processed by a video/audio controller 686 to generate a video output signal 676 that can subsequently be utilized, for example, with a TV or VCR. Additional tuners could also be used, if desired.

The methods described herein may be implemented in software, firmware, and/or hardware. A software implementation may include an article in the form of a machine-readable storage medium onto which there are stored instructions and data that form a software program to perform such methods. As an example, a DSP may include instructions or may be programmed with instructions stored in a storage medium to perform blind scanning in accordance with an embodiment of the present invention.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   receiving data corresponding to a portion of an incoming radio frequency (RF) spectrum in a satellite receiver;
   determining a set of estimates from the data, the set including one or more pairs of a channel frequency estimate and a symbol rate estimate, via a linear spectrum analysis including a first pass to determine if any frequency domain averaged fast fourier transform (FFT) bins for the data are above a threshold and a second pass to determine up-slope and down-slope edges of potential channels within the frequency domain averaged FFT bins above the threshold; and determining a refined set of estimates from the set of estimates via at least one non-linear spectrum analysis.

2. The method of claim 1, further comprising setting a bandwidth of a fine tuning filter of the satellite receiver to a value of the portion, wherein the value substantially corresponds to a bandwidth maximum of the fine tuning filter.

3. The method of claim 1, wherein determining the set of estimates comprises:
calculating fast fourier transforms (FFTs) for the data;
time domain averaging the FFTs into a plurality of bins; and
frequency domain averaging the plurality of bins to obtain a plurality of moving averaged bins.

4. The method of claim 3, further comprising searching the plurality of moving averaged bins for one or more valid channels.

5. The method of claim 1, wherein determining the refined set of estimates comprises:
adjusting a coarse tuning mixer of a receiver based on the channel frequency estimate;
removing modulation from an output of the coarse tuning mixer; and
calculating fast fourier transforms (FFTs) from the modulation removed output of the coarse tuning mixer.

6. The method of claim 5, further comprising adjusting a fine tuning mixer based on a refined channel frequency estimate.

7. The method of claim 1, wherein determining the refined set of estimates comprises:
calculating a magnitude of a digital filter output;
calculating fast fourier transforms (FFTs) from the calculated magnitude; and
determining a refined symbol rate estimate from the FFTs.

8. The method of claim 1, further comprising providing information obtained during determining the set of estimates to a host controller of the satellite receiver.

9. The method of claim 8, further comprising controlling a gain of the satellite receiver based on the information, the information comprising adjacent channel interference information.

10. An apparatus comprising:
a fast fourier transform (FFT) engine to receive incoming signals and to generate a plurality of FFTs;
a time domain engine to generate a plurality of time domain averaged FFT bins from the plurality of FFTs;
a frequency domain engine coupled to the time domain engine to generate a plurality of frequency domain averaged FFT bins from the time domain averaged FFT bins; and
a spectrum analyzer coupled to the time domain engine to determine a raw channel frequency estimate based on a linear spectrum analysis, including a first pass to determine if any of the frequency domain averaged FFT bins are above a predetermined threshold, a second pass to determine up-slope and down-slope edges of potential channels within the frequency domain averaged FFT bins above the predetermined threshold, and a third pass to determine a mean in-band FFT bin value for each of the potential channels.

11. The apparatus of claim 10, wherein the spectrum analyzer comprises a linear spectrum analyzer to generate the raw channel frequency estimate and a raw symbol rate estimate.

12. The apparatus of claim 11, wherein the spectrum analyzer further comprises a non-linear spectrum analyzer to generate a channel frequency estimate based on the raw channel frequency estimate.

13. The apparatus of claim 10, wherein the apparatus comprises a blind scan controller.

14. The apparatus of claim 13, wherein the blind scan controller is to send information regarding out-of-band signals to a host controller of a satellite receiver.

15. The apparatus of claim 13, wherein the blind scan controller is to control a frequency of an analog mixer based on the raw channel frequency estimate.

16. The apparatus of claim 13, wherein the blind scan controller is integrated on a single substrate with a satellite receiver.

17. The apparatus of claim 10, further comprising a spur detector to detect a receiver-generated noise bin in the time domain averaged FFT bins.

18. The apparatus of claim 17, wherein the spur detector is to indicate presence of the receiver-generated noise bin to a host controller, wherein the host controller is to adjust a clock of the receiver based on the indication.

19. A method comprising:
tuning a receiver to receive a portion of a radio frequency (RF) spectrum and generating digital data corresponding to the portion of the RF spectrum;
calculating a plurality of fast fourier transform (FFT) bins from the digital data;
determining if any of the FFT bins are above a predetermined threshold; and
retuning the receiver to a different portion of the RF spectrum if none of the FFT bins are above the predetermined threshold, otherwise performing a linear spectrum analysis on the FFT bins above the predetermined threshold, including a first pass to determine up-slope and down-slope edges of potential channels within the FFT bins above the predetermined threshold, and a second pass to determine an average FFT bin value for each of the potential channels.

20. The method of claim 19, wherein tuning the receiver comprises setting a digital filter to a maximum bandwidth.

21. A system comprising:
an analog mixer coupled to receive an incoming radio frequency (RF) spectrum and to generate a wideband signal from the incoming RF spectrum;
an analog-to-digital converter (ADC) coupled to the analog mixer to convert the wideband signal into a digital signal;
a digital filter coupled to the ADC to generate a filtered and decimated signal substantially corresponding to a maximum bandwidth of the digital filter from the digital signal, the digital filter set at the maximum bandwidth by a controller during a scan process; and
the controller coupled to receive the filtered and decimated signal and determine if any potential channels are present in the filtered and decimated signal, wherein the controller is to adjust the analog mixer if no potential channels are present based on a linear spectrum analysis and to determine an estimate pair of channel frequency and symbol rate for one or more potential channels if present, the linear spectrum analysis including a first pass to determine if any fast fourier transform (FFT) bins generated from the filtered and decimated signal are at least a predetermined threshold greater than a minimum one of the generated FFT bins, a second pass to determine up-slope and down-slope edges of potential channels within the FFT bins above the predetermined threshold, and a third pass to determine a mean in-band FFT bin value for each of the potential channels.

22. The system of claim 21, wherein the controller comprises a blind scan controller including:

a fast fourier transform (FFT) engine to receive the filtered and decimated signal and to generate a plurality of FFTs;

a time domain engine to generate a plurality of time domain averaged FFT bins from the plurality of FFTs; and a spectrum analyzer coupled to the time domain engine to determine a raw channel frequency estimate based on the linear spectrum analysis.

* * * * *